(12) United States Patent
Cutkosky et al.

(10) Patent No.: US 9,871,183 B2
(45) Date of Patent: Jan. 16, 2018

(54) ELECTROSTRICTIVE ELEMENT

(71) Applicants: The Board of Trustees of the Leland Stanford Junior University, Palo Alto, CA (US); HONDA MOTOR CO., LTD., Tokyo (JP)

(72) Inventors: Mark R. Cutkosky, Palo Alto, CA (US); Atsuo Orita, Saitama (JP)

(73) Assignees: THE BOARD OF TRUSTEES OF THE LELAND STANFORD JUNIOR UNIVERSITY, Palo Alto, CA (US); HONDA MOTOR CO., LTD., Tokyo (JP)

( * ) Notice: Subject to any disclaimer, the term of this patent is extended or adjusted under 35 U.S.C. 154(b) by 265 days.

(21) Appl. No.: 14/724,196

(22) Filed: May 28, 2015

(65) Prior Publication Data

US 2016/0351784 A1 Dec. 1, 2016

(51) Int. Cl.
*H02N 11/00* (2006.01)
*H01L 41/047* (2006.01)
*H01L 41/09* (2006.01)

(52) U.S. Cl.
CPC ........ *H01L 41/047* (2013.01); *H01L 41/0478* (2013.01); *H01L 41/0986* (2013.01)

(58) Field of Classification Search
CPC .............. H01L 41/047; H01L 41/0478; H01L 41/0986
USPC ........................................................ 310/300
See application file for complete search history.

(56) References Cited

U.S. PATENT DOCUMENTS

| 2013/0301101 A1* | 11/2013 | Conrad .............. G02B 26/0841 359/221.2 |
| 2013/0307370 A1* | 11/2013 | Jenninger ............. H01L 41/113 310/300 |
| 2013/0307371 A1* | 11/2013 | Sakashita ............. H01L 41/113 310/300 |
| 2014/0333992 A1 | 11/2014 | Wagemans et al. |

FOREIGN PATENT DOCUMENTS

| DE | 60037433 T2 | 12/2008 |
| DE | 102013206429 A1 | 10/2014 |
| JP | 2005-347364 | 12/2005 |

OTHER PUBLICATIONS

German Office Action with English Translation dated Nov. 22, 2016, 14 pages.

(Continued)

*Primary Examiner* — Forrest M Phillips
(74) *Attorney, Agent, or Firm* — Rankin, Hill & Clark LLP

(57) ABSTRACT

The present invention provides an electrostrictive element capable of preventing breakdown of a dielectric film. An electrostrictive element 1 includes a dielectric film 2 composed of an elastomer, a film electrode 3 formed inside a peripheral edge on at least one surface of the dielectric film 2 and capable of expanding and contracting so as to follow expansion and contraction of the dielectric film 2, and a frame 4 to keep the dielectric film 2 in an expansion state. The film electrode 3 includes portions 6, 7, 8 having a lower conductivity or a portion 9 having a higher rigidity than the other portion on a portion to be subjected to a greater total stress of a mechanical stress and an electrical stress than the other portion of the dielectric film 2.

8 Claims, 5 Drawing Sheets

(56) References Cited

OTHER PUBLICATIONS

German Search Report with English Translation dated Nov. 22, 2016, 16 pages.
Kaal; "Dielectric Elastomer Stack Electrodes with Perforated Electrodes for Structural-Dynamic Applications"; Darmstadt, Techn. Univ., Diss., 2014, 5 pages.

* cited by examiner

ELECTROSTRICTIVE ELEMENT

BACKGROUND OF THE INVENTION

Field of the Invention

The present invention relates to an electrostrictive element.

Description of the Related Art

It is known that when at least one surface of a dielectric film composed of an elastomer is connected with an electrode to which voltage is applied, the dielectric film receives a compressive force by Maxwell stress (piezoelectric opposite effect) from interfacial polarization caused by an electrostatic force, and contracts in a thickness direction and expands in a lateral direction (direction orthogonal to the thickness direction). In recent years, it has been considered to use as a piezoelectric element an electrostrictive element that comprises a dielectric film and an electrode, and operates in accordance with that principle.

As such a piezoelectric element, a piezoelectric element is hitherto known that comprises a dielectric film composed of an elastomer, a first electrode layer capable of expanding and contracting and formed on at least one surface of the dielectric film, a piezoelectric crystal thin film capable of expanding and contracting and formed on the first film electrode, and a second electrode layer capable of expanding and contracting and formed on the piezoelectric crystal thin film (for example, see Japanese Patent Laid-Open No. 2005-347364).

However, the piezoelectric element has a drawback in which the dielectric film may easily break down at a portion that has become thinner receiving a compression force due to Maxwell stress when voltage is applied to the first electrode layer, because the first electrode layer is formed over an entire surface of the dielectric film composed of the elastomer. The drawback may arise in cases other than using the electrostrictive element as a piezoelectric element.

SUMMARY OF THE INVENTION

Therefore, an objective of the present invention is to provide an electrostrictive element capable of preventing breakdown of a dielectric film by eliminating the drawback.

Because Maxwell stress is inversely proportional to the square of thickness of a dielectric film, a phenomenon called pull-in effect, in which Maxwell stress increases exponentially, occurs at a portion that is subjected to a greater total stress than the other portion and has become thinner. Therefore, breakdown of the dielectric film of an electrostrictive element is considered to be caused by a reason that the dielectric film becomes significantly thinner due to the pull-in effect and insulation limit voltage becomes lower than applied voltage.

Consequently, in order to achieve the objective, an electrostrictive element of the present invention comprises: a dielectric film composed of an elastomer; a film electrode formed inside a peripheral edge of at least one surface of the dielectric film, the film electrode being capable of expanding and contracting so as to follow expansion and contraction of the dielectric film; and a frame to keep the dielectric film in an expansion state, wherein the film electrode comprises a potion having a lower conductivity or a portion having a higher rigidity than the other portion at a portion to be subjected to a greater total stress of a mechanical stress and an electrical stress than the other portion of the dielectric film.

In the electrostrictive element of the present invention, the film electrode comprises a potion having a lower conductivity or a portion having a higher rigidity than the other portion of the film electrode on a portion to be subjected to a greater total stress of a mechanical stress and an electrical stress than the other portion of the dielectric film, and thereby the effect by Maxwell stress is reduced at the portion to be subjected to a greater total stress, and eventually the pull-in effect can be reduced. Therefore, the electrostrictive element of the present invention can prevent breakdown of the dielectric film.

In the electrostrictive element of the present invention, the portion to be subjected to a greater total stress than the other portion of the dielectric film is a portion close to an edge portion of the film electrode.

In addition, in the electrostrictive element of the present invention, the portion having a lower conductivity than the other portion of the film electrode can be configured by a slit-shaped hole portion or a dot-shaped hole portion formed on the film electrode. The slit-shaped hole portion can be provided, for example, radially, concentrically, or spirally with respect to a center of the film electrode.

In addition, in the electrostrictive element of the present invention, the portion having a higher rigidity than the other portion of the film electrode can be formed by an elastomer or a resin layer having a high rigidity arranged by coating a peripheral edge portion of the film electrode.

In addition, in the electrostrictive element of the present invention, the film electrode can be formed by a conductive paste or a carbonaceous material capable of expanding and contracting. The film electrode can be formed by spray coating the conductive paste, but forming it by screen printing of the conductive paste is preferable to form conductivity as designed.

Furthermore, the electrostrictive element of the present invention can be made such that the dielectric film includes at least a first dielectric film and a second dielectric film. In this case, the electrostrictive element of the present invention preferably comprises: a first film electrode having a uniform conductivity and sandwiched by the first dielectric film and the second dielectric film; a second film electrode formed on an opposite surface of the first dielectric film to the first film electrode, and comprising a portion having a lower conductivity than the other portion at a portion to be subjected to a greater total stress of a mechanical stress and an electrical stress than the other portion of the first film electrode; and a third film electrode formed on an opposite surface of the second dielectric film to the first film electrode, and comprising a portion having a lower conductivity than other portion at a position different from a portion of the second film electrode to be subjected to a greater total stress of a mechanical stress and an electrical stress than other portion of the second film electrode.

The electrostrictive element of the present invention can prevent breakdown of each dielectric film even if the electrostrictive element comprises a first dielectric film and a second dielectric film by employing the configuration.

DETAILED DESCRIPTION OF THE PREFERRED EMBODIMENTS

Now, embodiments of the present invention will be described in more detail with reference to the attached drawings.

Figure 1:
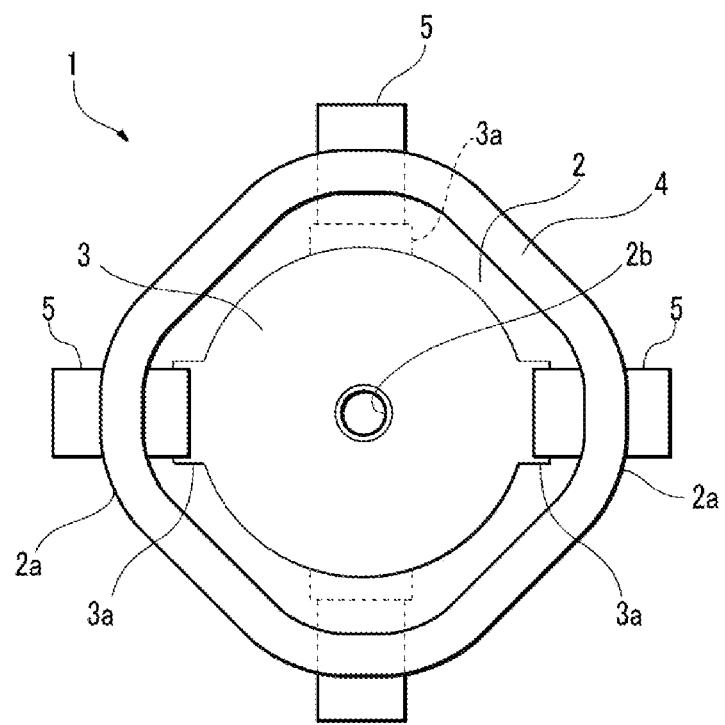
FIG. 1 is a plan view showing a configuration example of an electrostrictive element.

An electrostrictive element 1 includes, for example as shown in FIG. 1, a dielectric film 2 composed of an elastomer, a film electrode 3 formed inside a peripheral edge of the dielectric film 2, a frame 4 to keep the dielectric film 2 in an expansion state, and a current collector 5 to supply power to the film electrode 3.

The dielectric film 2 is composed of an elastomer having a generally square-shape with round angle portions 2a (for example, a product named VHB4910 manufactured by 3M Company), and includes a through-hole 2b at a center.

The film electrode 3 is formed in a doughnut-shape on at least one surface of the dielectric film 2 inside the frame 4. In addition, the film electrode 3 comprises two protrusions 3a protruding toward the outside at portions facing the angle portions 2a of the dielectric film 2, and each protrusion 3a is connected with a current collector 5 composed of a metal foil such as a copper foil.

The film electrode 3 is formed, for example, by screen printing of a conductive paste, and is capable of expanding and contracting so as to follow expansion and contraction of the dielectric film 2. The film electrode 3 may be provided on both front and rear surfaces of the dielectric film 2, and in this case a line connecting between the protrusions 3a, 3a of one surface is orthogonal to a line connecting between the protrusions 3a, 3a of a surface on the opposite side.

In the electrostrictive element 1, when voltage is applied to the dielectric film 2 via the current collector 5, the dielectric film 2 is compressed in a thickness direction by Maxwell stress and expands in a lateral direction (direction orthogonal to the thickness direction). At this time, as the peripheral edge of the dielectric film 2 is held by the frame 4, the dielectric film 2 expands toward the inside due to restriction on expansion toward the outside, and protrudes toward one surface side to form a generally mountain-like shape as a whole.

The dielectric film 2 having a generally mountain-like shape is subjected to a greater total stress of a mechanical stress and an electrical stress than the other portion at portions close to its summit and base, i.e. portions close to edge portions of the film electrode 3. Consequently, thickness of the dielectric film 2 becomes thinner at the portions close to the summit and base than the other portion, which causes the pull-in effect in which Maxwell stress increases exponentially, and its thickness becomes even thinner. Thereby, the dielectric film 2 has a risk of rupture.

Therefore, in the electrostrictive element 1 of the embodiment, the film electrode 3 comprises a portion having a lower conductivity or a portion having a higher rigidity than the other portion of the film electrode 3 on a portion to be subjected to a greater total stress than the other portion and close to its summit and base when the dielectric film 2 has formed a generally mountain-like shape. Thus, the effect of Maxwell stress can be reduced at the portion having a lower conductivity or the portion having a higher rigidity than the other portion of the dielectric film 2, the pull-in effect can be also reduced, and rupture of the dielectric film 2 can be prevented.

The portion having a lower conductivity than the other portion of the film electrode 3 can be formed, for example, by providing a slit-shaped or dot-shaped minute hole portion on the film electrode 3.

Figure 2A:
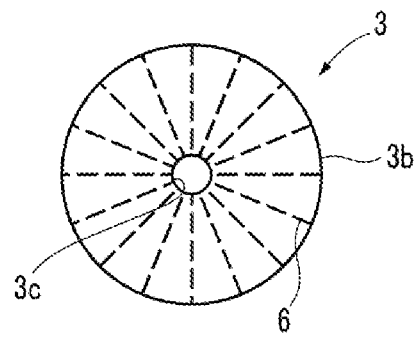
FIG. 2A is a plan view showing a first aspect of arrangement of a slit-shaped hole portion in an electrostrictive element of the present invention.

In particular, the portion having a lower conductivity than the other portion can be formed, as shown in FIG. 2A, by providing a plurality of minute linear slit-shaped hole portions 6 radially with respect to a center of the film electrode 3 (through-hole 2b of the dielectric film 2). Note that FIGS. 2A to 2C, 3A, 3B, and 4A to 4C show the film electrode 3 whose protrusions 3a are omitted.

Figure 2B:
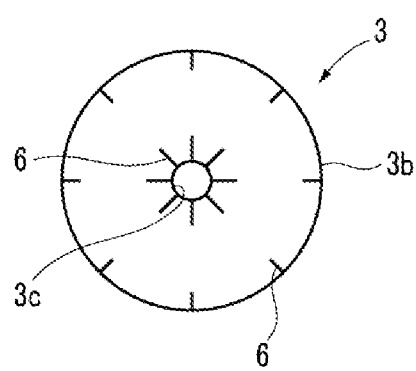
FIG. 2B is a plan view showing a first variant example of FIG. 2A.
Figure 2C:
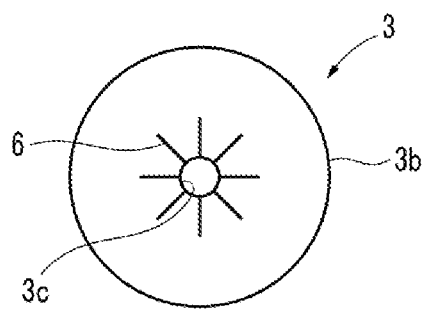
FIG. 2C is a plan view showing a second variant example of FIG. 2A.

In the case of providing the linear slit-shaped hole portions 6, they are provided over the whole length between the outer peripheral edge 3b and the inner peripheral edge 3c of the film electrode 3 in FIG. 2A. However, the slit-shaped hole portions 6 may be provided only in the vicinity of the outer peripheral edge 3b and in the vicinity of the inner peripheral edge 3c as shown in FIG. 2B, or may be provided only in the vicinity of the inner peripheral edge 3c as shown in FIG. 2C.

Figure 3A:
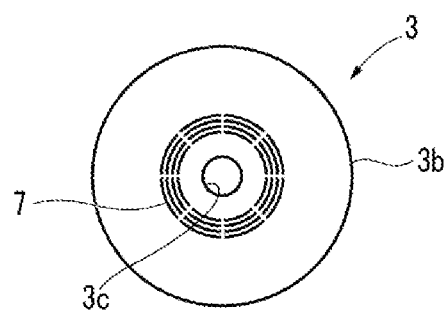
FIG. 3A is a plan view showing a second aspect of arrangement of a slit-shaped hole portion in an electrostrictive element of the present invention.
Figure 3B:
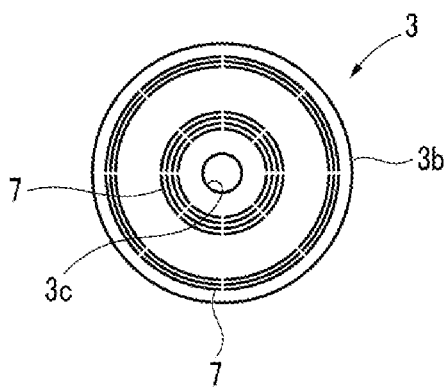
FIG. 3B is a plan view showing a variant example of FIG. 3A.

In addition, the portion having a lower conductivity than the other portion may be formed, as shown in FIG. 3A, by providing a plurality of minute arcuate slit-shaped hole portions 7 concentrically with respect to the center of the film electrode 3 (through-hole 2b of the dielectric film 2). The arcuate slit-shaped hole portions 7 are provided only in the vicinity of the inner peripheral edge 3c of the film electrode 3 in FIG. 3A, but may be provided in the vicinity of the outer peripheral edge 3b and in the vicinity of the inner peripheral edge 3c as shown in FIG. 3B.

Figure 4A:
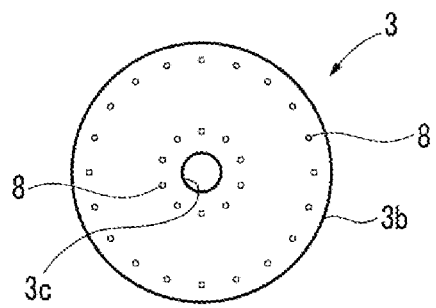
FIG. 4A is a plan view showing arrangement of a dot-shaped hole portion in an electrostrictive element of the present invention.
Figure 4B:
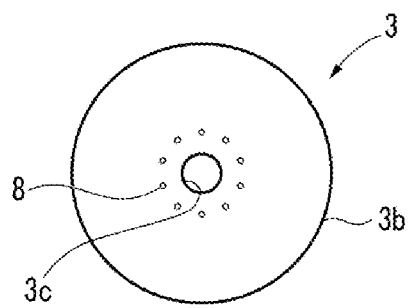
FIG. 4B is a plan view showing a first variant example of FIG. 4A.
Figure 4C:
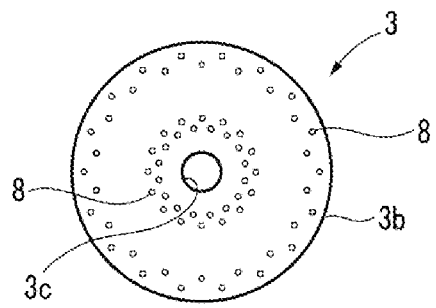
FIG. 4C is a plan view showing a second variant example of FIG. 4A.

Furthermore, the portion having a lower conductivity than the other portion may be formed, as shown in FIG. 4A, by providing a plurality of minute dot-shaped hole portions 8 on the film electrode 3. In the case of providing the dot-shaped hole portions 8, they are provided on one line in the vicinity of the outer peripheral edge 3b and the inner peripheral edge 3c of the film electrode 3 in FIG. 4A, but may be provided in the vicinity of only the inner peripheral edge 3c as shown in FIG. 4B, and may be provided on two lines in the vicinity of the outer peripheral edge 3b and the inner peripheral edge 3c as shown in FIG. 4C.

The film electrode 3 comprising the slit-shaped hole portions 6, 7 or dot-shaped hole portions 8 can be formed, for example, by application of a mask corresponding to the slit-shaped hole portions 6, 7 or dot-shaped hole portions 8 on the dielectric film 2, and screen printing of a conductive paste via the mask.

Figure 5:
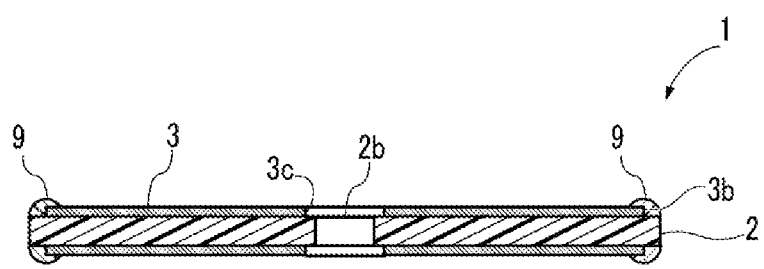
FIG. 5 is a cross-sectional view schematically showing arrangement of a high-rigidity elastomer layer in an electrostrictive element of the present invention.

On the other hand, the portion having a higher rigidity than the other portion of the film electrode 3 can be formed, as shown in FIG. 5, by arranging on the film electrode 3, for example, a high-rigidity elastomer layer 9 coating the outer peripheral edge 3b. Examples of a high-rigidity elastomer constituting the elastomer layer 9 may include urethane rubber and silicon rubber or the like.

In the embodiment, the elastomer layer 9 is arranged to coat the outer peripheral edge 3b of the film electrode 3. However, the elastomer layer 9 may be arranged to coat the inner peripheral edge 3c of the film electrode 3, or may be arranged to coat both outer peripheral edge 3b and inner peripheral edge 3c.

Figure 6:
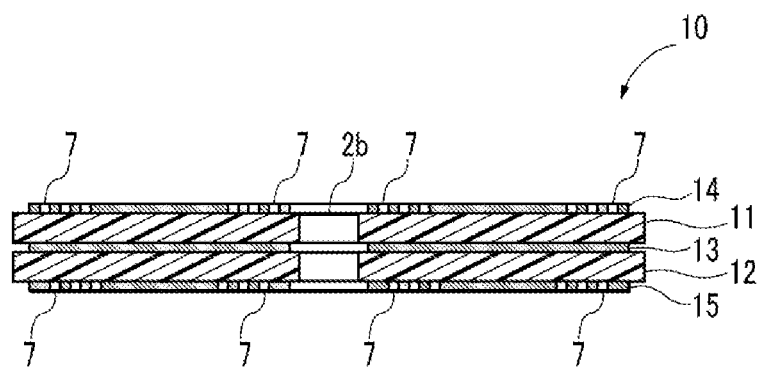
FIG. 6 is a cross-sectional view schematically showing a second configuration example of an electrostrictive element of the invention.

In addition, an electrostrictive element 10 of the embodiment may comprise a first dielectric film 11 and a second dielectric film 12 as shown in FIG. 6. In this case, a first film electrode 13 with a uniform conductivity and without any slit-shaped hole portions 6, 7 or dot-shaped hole portions 8 is sandwiched in between the first dielectric film 11 and the second dielectric film 12, whereas the electrostrictive element 10 comprises a second film electrode 14 and a third film electrode 15 comprising arcuate slit-shaped hole portions 7 at portions to be subjected to a greater total stress than the other portion of opposite (outer) surfaces of the first dielectric film 11 and the second dielectric film 12 to the first film electrode 13.

In the electrostrictive element 10, the arcuate slit-shaped hole portions 7 of the second film electrode 14 and the arcuate slit-shaped hole portions 7 of the third film electrode 15 are provided at different positions from each other so that they do not overlap with each other. In this manner, the electrostrictive element 10 can effectively prevent the first dielectric film 11 and the second dielectric film 12 from breaking down.

Although the electrostrictive element 10 comprising the arcuate slit-shaped hole portions 7 is described in the embodiment, it may comprise the linear slit-shaped hole portions 6 or dot-shaped hole portions 8. In this case also, in a similar way to FIG. 6, the linear slit-shaped hole portions 6 or dot-shaped hole portions 8 of the second film electrode 14 and the linear slit-shaped hole portions 6 or dot-shaped hole portions 8 of the third film electrode 15 are provided at different positions from each other so that they do not overlap with each other.

In addition, the electrostrictive element 10 comprising two dielectric films of the first dielectric film 11 and the second dielectric film 12 is described, but it may comprise three or more dielectric films. In the case of comprising three or more dielectric films, a film electrode with a uniform conductivity and without any slit-shaped hole portions 6, 7 or dot-shaped hole portions 8 is sandwiched in between two dielectric films, and film electrodes comprising the slit-shaped hole portions 6, 7 or dot-shaped hole portions 8 are arranged on outer surfaces of most outer layer dielectric films.

In addition, in each of the above-described embodiments, the film electrode 3 is formed by a conductive paste, but a carbonaceous material capable of expanding and contracting may be used instead of the conductive paste. Examples of the carbonaceous material capable of expanding and contracting may include a sheet-shaped carbon nanotube aggregate oriented toward a fiber direction in the state of a plurality of carbon nanotubes overlapping with each other in the fiber direction, or a string-shaped carbon nanotube aggregate oriented toward a fiber direction in the state of the plurality of carbon nanotubes overlapping with each other in the fiber direction and accumulating in a radial direction. The carbon nanotube aggregate is arranged such that its fiber direction and the expanding and contracting direction of the dielectric film are in agreement with each other.

In addition, in each of the above-described embodiments, the portion having a lower conductivity than the other portion of the film electrode 3 is formed by providing the slit-shaped hole portions 6, 7 or dot-shaped hole portions 8. However, the portion having a lower conductivity than the other portion of the film electrode 3 has only to be provided on a portion to be subjected to a greater total stress than the other portion, and may be formed, for example, by making the film electrode 3 into a mesh-shape.

In addition, in each of the above-described embodiments, the potion having a higher rigidity than the other portion of the film electrode 3 is formed by the high-rigidity elastomer layer 9, but resin having a high-rigidity may be used instead of a high-rigidity elastomer.

REFERENCE SIGNS LIST 1, 10 ELECTROSTRICTIVE ELEMENT
2, 11, 12 DIELECTRIC FILM
3, 13, 14 FILM ELECTRODE
6, 7 SLIT-SHAPED HOLE PORTION
8 DOT-SHAPED HOLE PORTION
9 ELASTOMER LAYER

What is claimed is:

1. An electrostrictive element comprising:
a dielectric film composed of an elastomer;
a film electrode formed inside a peripheral edge of at least one surface of the dielectric film, the film electrode being capable of expanding and contracting so as to follow expansion and contraction of the dielectric film; and
a frame to keep the dielectric film in an expansion state,
wherein the film electrode comprises a portion having a hole portion and a lower conductivity than other portion of the film electrode, at a portion of the dielectric film, the portion of the dielectric film being a portion to be subjected to a greater total stress of a mechanical stress and an electrical stress than other portion of the dielectric film.

2. The electrostrictive element according to claim 1, wherein the portion of the dielectric film to be subjected to the greater total stress than the other portion of the dielectric film is a portion close to an edge portion of the film electrode.

3. The electrostrictive element according to claim 1, wherein the hole portion is a slit-shaped hole portion or a dot-shaped hole portion.

4. The electrostrictive element according to claim 3, wherein the hole portion is the slit-shaped hole portion, and is provided radially, concentrically, or spirally with respect to a center of the film electrode.

5. The electrostrictive element according to claim 1, wherein the film electrode is formed by a conductive paste or carbonaceous material capable of expanding and contracting.

6. An electrostrictive element comprising:
a dielectric film composed of an elastomer, wherein the dielectric film includes at least a first dielectric film and a second dielectric film;
a first film electrode, a second film electrode, and a third film electrode, wherein the first film electrode, the second film electrode, and the third film electrode are all formed inside a peripheral edge of at least one surface of the dielectric film, and the first film electrode, the second film electrode, and the third film electrode are all capable of expanding and contracting so as to follow expansion and contraction of the dielectric film; and a frame to keep the dielectric film in an expansion state, wherein:

the first film electrode is sandwiched by the first dielectric film and the second dielectric film, and the first film electrode has a uniform conductivity;

the second film electrode is formed on an opposite surface of the first dielectric film to the first film electrode, the second film electrode comprises a second film electrode portion having a second film electrode hole portion and lower conductivity than other portion of the second film electrode at a portion of the first film electrode, the portion of the first film electrode being a portion to be subjected to a greater total stress of a mechanical stress and an electrical stress than other portion of the first film electrode; and the third film electrode is formed on an opposite surface of the second dielectric film to the first film electrode, the third film electrode comprises a third film electrode portion having a third film electrode hole portion and lower conductivity than other portion of the third film electrode at a position different from the second film electrode portion.

7. An electrostrictive element comprising:

a dielectric film composed of an elastomer;

a film electrode formed inside a peripheral edge of at least one surface of the dielectric film, the film electrode being capable of expanding and contracting so as to follow expansion and contraction of the dielectric film; and a frame to keep the dielectric film in an expansion state, wherein the film electrode comprises a portion having a higher rigidity than other portion of the film electrode, at a portion of the dielectric film, the portion of the dielectric film being a portion to be subjected to a greater total stress of a mechanical stress and an electrical stress than other portion of the dielectric film.

8. The electrostrictive element according to claim 7, wherein the portion of the film electrode having the higher rigidity than the other portion of the film electrode is formed by a high-rigidity elastomer or resin layer arranged by coating a peripheral edge portion of the film electrode.

* * * * *